United States Patent [19]

Tsunoda et al.

[11] 4,342,023
[45] Jul. 27, 1982

[54] NOISE LEVEL CONTROLLED VOICE WARNING SYSTEM FOR AN AUTOMOTIVE VEHICLE

[75] Inventors: Masakazu Tsunoda, Fujisawa; Teruo Kawasaki, Yokohama, both of Japan

[73] Assignee: Nissan Motor Company, Limited, Kanagawa, Japan

[21] Appl. No.: 182,238

[22] Filed: Aug. 28, 1980

[30] Foreign Application Priority Data

Aug. 31, 1979 [JP] Japan ........................... 54-119116[U]

[51] Int. Cl.³ .......................... G08B 21/00; B60Q 5/00
[52] U.S. Cl. ................................ 340/52 F; 179/1 SM; 340/521; 340/692
[58] Field of Search ...................... 340/692, 52 F, 521; 179/1 SM; 369/425, 424

[56] References Cited

U.S. PATENT DOCUMENTS 3,859,629 1/1975 Komiyama et al. ................. 340/692
3,909,842 9/1975 Noji .
4,072,850 2/1978 McGlynn .......................... 340/52 F
4,135,143 1/1979 Argentieri et al. .................. 340/692

FOREIGN PATENT DOCUMENTS 2741837 9/1977 Fed. Rep. of Germany .
226038 12/1924 United Kingdom .
631183 10/1949 United Kingdom .
998437 7/1965 United Kingdom .
1320970 6/1973 United Kingdom .
1427133 3/1976 United Kingdom .
1449825 9/1976 United Kingdom .
1462052 1/1977 United Kingdom .
1496551 12/1977 United Kingdom .
1518574 7/1978 United Kingdom .
2001220 1/1979 United Kingdom .
2013051 8/1979 United Kingdom .

OTHER PUBLICATIONS

Bodley, Nicholas, "Here's a Breakthrough—a Low-Cost Speech Synthesizer on a Chip", Electronic Design, 7/19/78.

Primary Examiner—Glen R. Swann, III
Attorney, Agent, or Firm—Lowe, King, Price & Becker

[57] ABSTRACT

A voice warning system for an automotive vehicle automatically adjusts the voice volume to an appropriate sound level in accordance with the noise level within the passenger compartment. The improved system incorporates a noise level sensor and an electronic volume control in a voice warning system which includes a plurality of information switches and a multiplexer for providing control signals for an LPC-type voice synthesizer cooperating with a voice memory under control of a microcomputer to provide appropriate warning announcements.

3 Claims, 3 Drawing Figures

NOISE LEVEL CONTROLLED VOICE WARNING SYSTEM FOR AN AUTOMOTIVE VEHICLE

BACKGROUND OF THE INVENTION

1. Field of the Invention

The present invention relates generally to a voice warning system for an automotive vehicle, and more particularly to a voice volume controller provided for the voice warning system whereby the voice volume is automatically adjusted to an appropriate sound level according to changes in the noise level within the passenger compartment. In this case, noise includes all the sound within the passenger compartment other than the warning voice produced from the voice warning system of the present invention.

2. Description of the Prior Art

Heretofore, as means for informing the driver of various vehicle operating conditions, there have been used various meters with pointers and various warning indication lamps. In addition, recently, there have appeared vehicles in which a computer is mounted so as to display digitally various vehicle operating conditions whenever the driver depresses pushbuttons to obtain the vehicle conditions. That is to say, in these devices, the driver is informed of the vehicle conditions through the sense of sight. On the other hand, as devices by which the driver is informed through the sense of hearing, there have been used various devices which produce a simple warning sound such as buzzer or chime.

Although these conventional warning devices which depend upon the sense of sight have the advantage that a number of vehicle conditions can be displayed at the same time, it is comparatively difficult to attract the driver's attention and to give the driver complicated information. Also, in the case of the conventional devices which depend upon the sense of hearing, it is difficult to inform the driver of different items of information, even if the device can attract the driver's attention.

Therefore, recently, various voice warning systems have come to be used for vehicles by which the driver can hear various vehicle operating conditions such as the distance traveled detected by a trip meter, the amount of fuel consumed and so on, in voice form.

When such a device as described above is used for an automotive vehicle, it is possible to attract the driver's attention well and also to inform the driver of relatively complicated vehicle operating conditions without any difficulties. In this case, however, when the passenger compartment is noisy because the car radio or other equipment is turned on, because the passengers are talking to each other, or because the car is traveling along a noisy street, it is impossible to hear the voice warning information clearly unless the volume is adjusted to a higher level.

However, if the voice volume is permanently adjusted to a high level, the problem arises that the voice is too loud, especially when the passenger compartment is quiet or when the vehicle is traveling along a quiet street at night.

Therefore, there is a need for a voice warning system for an automotive vehicle by which the driver can always hear the warning voice at an appropriate sound level.

BRIEF SUMMARY OF THE INVENTION

With these problems in mind, therefore, it is the primary object of the present invention to provide a voice warning system for an automotive vehicle which can detect the noise level within the passenger compartment and can adjust the warning volume according to the detected noise level, so that the driver can always hear the voice information at an appropriate sound level according to the noise level within the passenger compartment, without the volume being excessive under any ambient noise conditions.

To achieve the above-mentioned object, the voice warning system of the present invention comprises a noise level sensor and a voice volume controller in addition to a voice warning system for an automotive vehicle.

BRIEF DESCRIPTION OF THE DRAWINGS

The features and advantage of the voice warning system of the present invention will be more clearly appreciated from the following description taken in conjunction with the accompanying drawings in which like reference numerals designate corresponding elements, and in which.

DETAILED DESCRIPTION OF THE PREFERRED EMBODIMENTS

Figure 1:
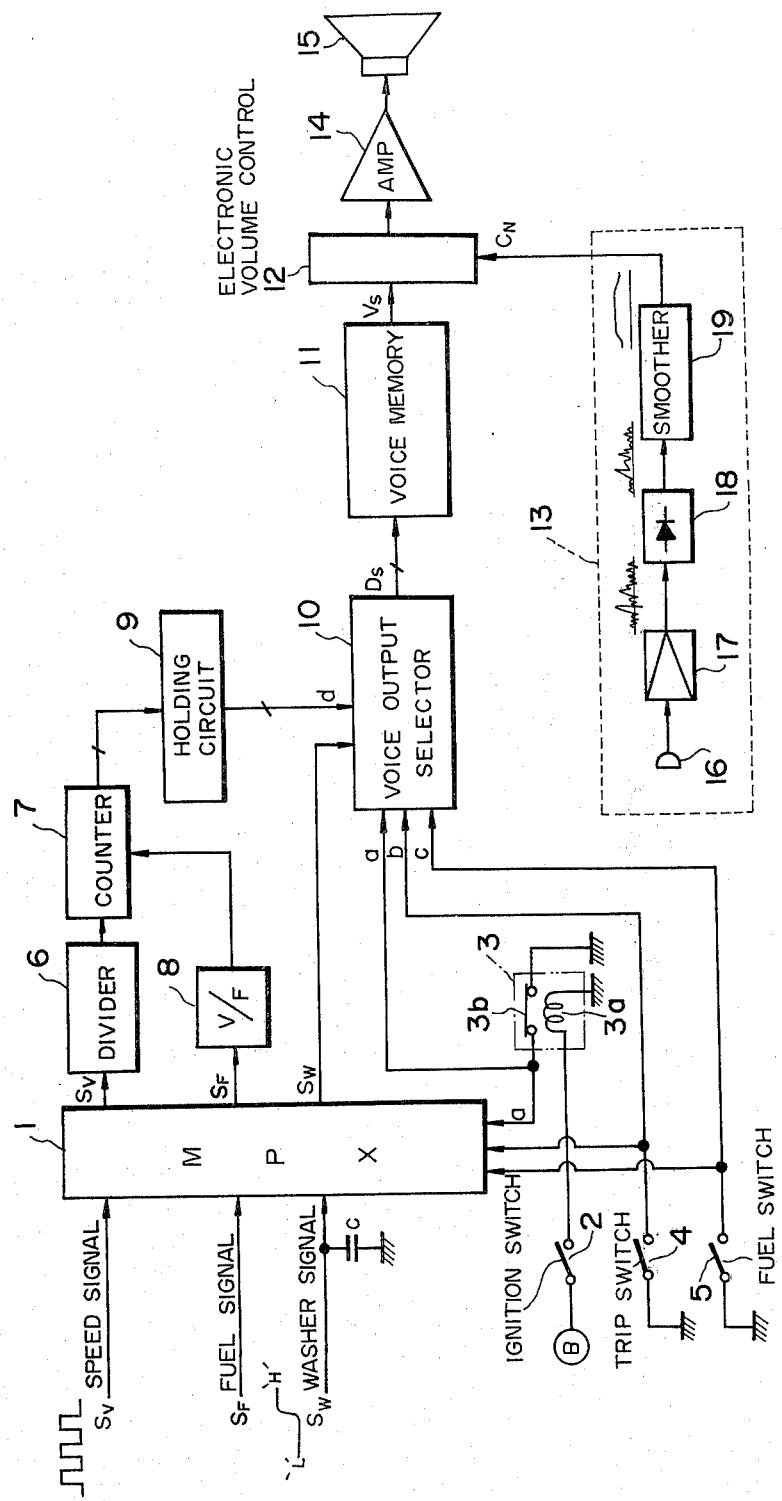
FIG. 1 is a schematic block diagram of a first embodiment of the present invention.

Reference is now made to the figures, and more specifically to FIG. 1, wherein a first preferred embodiment of the present invention is illustrated.

In FIG. 1, the numeral 1 denotes a multiplexer to which are inputted various signals for indicating vehicle operating conditions such as a vehicle speed pulse signal $S_v$ from a speed sensor, a fuel voltage signal $S_f$ from a fuel sensor indicating the amount of remaining fuel, and a washer liquid L/H level voltage signal $S_w$ from a washer liquid sensor where the detected voltage level is changed from "H" to "L" when the level of the washer liquid decreases below a predetermined level. One of these signals $S_v$, $S_f$, and $S_w$ is selectively output to the next stage when any of the points a, b, and c connected to the control terminals of the multiplexer 1 is turned to a ground level by actuating any of the switches 2, 4, and 5.

In more detail, the numeral 2 denotes an ignition switch to output the washer liquid signal $S_w$ from the multiplexer 1 in such a way that when the switch 2 is turned on, a current flows from a battery B to a coil 3a of a relay 3 to open a normally-closed contact 3b and when turned off, the current is cut off to close the contact 3b, namely, to ground the point a. Further, in this case, the washer liquid signal is held for a while by a condenser C after the ignition switch 2 has been turned off.

The switch 4 is a trip switch to output the speed signal $S_v$ from the multiplexer 1 by connecting point b to the ground level when turned on. And, also, the switch 5 is a fuel switch to output the fuel signal $S_f$ from the multiplexer 1 by connecting point c to the ground level when turned on.

When output from the multiplexer 1, the vehicle speed signal $S_v$ is divided by a divider 6, counted by a counter 7, and stored as information indicative of distance traveled in a holding circuit 9 every time the number counted by the counter 7 reaches a predetermined value (for example, corresponding to traveling a distance of 5 km).

When output from the multiplexer 1, the fuel signal $S_f$ is converted into a pulse signal of a frequency corresponding to the signal voltage by a V-F converter 8, counted for a given period by the counter 7, and held in the holding circuit 9 as information indicating the amount of remaining fuel.

On the other hand, the washer signal $S_w$ is directly output to the next stage.

The numeral 10 denotes a voice output selector, which inputs a signal d held in the holding circuit 9 or the washer signal $S_w$ (L/H level signal) as the data signal when any of ignition switch 2, trip switch 4, and fuel switch 5 is turned on to ground one of the points a, b, and c. Voice output selector 10 next selects the voice outputs, for example, such as "Replenish washer liquid", or "Fuel tank is now half full", which are previously stored in a voice memory 11, in accordance with the signal d or $S_w$, and finally outputs a voice output designation signal $D_s$, in the form of a binary digit code, to select one of the voice outputs in a voice memory 11.

The voice selector 10 can be formed by using a wired logic system, but may also be implemented by means of a program for a microcomputer, as will be explained in the second embodiment.

In the voice memory 11, necessary warnings are stored in units of sentences, phrases, words, or phonemes. The warnings are output as a series of voice signals $V_s$ after selection in accordance with the voice output designation signal $D_s$, output from the voice output selector 10.

In the voice memory 11, in the case where the number of different items of information to be noticed is small, it is possible to record the necessary voice information on different tracks of an endless tape, select the track on which the required information is recorded in accordance with the voice output designation signal $D_s$, and reproduce the warning through a speaker.

However, in the case where the number of different items of information is large or the information varies, a magnetic recording device as explained above may become exessively bulky, the access time also becoming long, and it may be difficult to change the information freely. Therefore, in this case, it is very convenient to use a synthesizer using a linear prediction coding system which has recently put on the market by the Texas Instruments Incorporated in the USA, as explained in the second embodiment.

The voice signal $V_s$ outputted from the voice memory 11 is amplified by an amplifier 14 after passing through an electronic volume control 12 by which the signal $V_s$ is controlled in accordance with a volume control signal $C_n$ detected by a noise sensor 13.

Further, after being amplified, the signal $V_s$ is output in voice form through a separate speaker 15 or a speaker used with other audio equipment within the vehicle.

The noise sensor 13, as shown by dashed lines in FIG. 1, comprises a microphone 16, an amplifier 17, a rectifier 18, and smoother 19.

The microphone 16 is disposed in the vicinity of the speaker 15 within the passenger compartment, facing away from the speaker 15, so as to collect all noise generated inside and outside the passenger compartment. The noise signal, converted from acoustic energy to electronic energy, is amplified by the amplifier 17, rectified by the rectifier 18, and is smoothed by the smoother 19, so that a control signal $C_n$ is outputted indicating an average noise level.

The electronic volume control 12 is adjusted according to the control signal $C_n$. In this case, however, it is desirable to design the smoother 19 having a relatively large time constant so that the control signal $C_n$ varies slowly with a delay time.

The electronic volume control 12 may be a well-known voltage-control type volume control using transistors and FETs. If the volume control is designed so that the higher the control signal $C_n$, the less the attenuation of the voice signal $V_s$, it is possible to control the warning volume according to the noise level so that the warning are louder when the noise level is high, and quieter when low.

Further, the electronic volume control 12 can be provided within the amplifier 14, or the amplifier itself 14 can be designed as a voltage control type variable gain amplifier.

Figure 2:
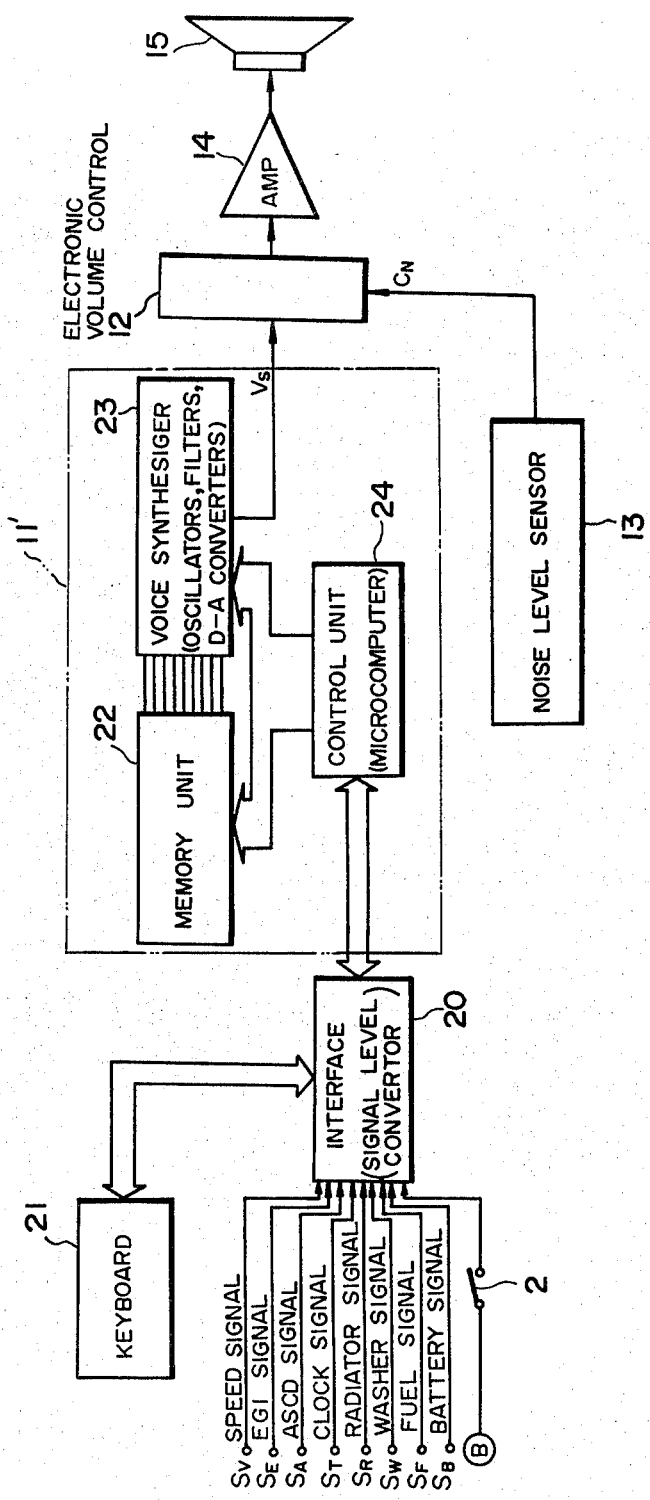
FIG. 2 is a schematic block diagram of a second embodiment of the present invention.
Figure 3:
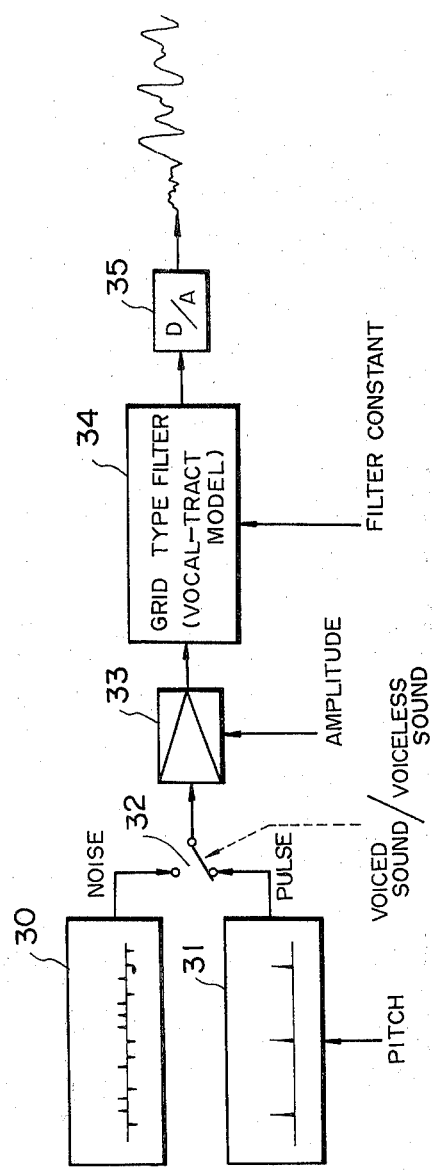
FIG. 3 is a schematic block diagram of assistance in explaining the theory of operation of a voice synthesizer using a linear prediction coding system (LPC).

Reference is now made to FIGS. 2 and 3, wherein a second preferred embodiment of the present invention is illustrated. In this case, the embodiment comprises a microcomputer and a voice synthesizer.

In FIG. 2, the numeral 20 denotes an input/output interface for a microcomputer, which also includes, for example, a signal level converter, and an A-D converter. In the same way as in the first embodiment, the on/off signal of an ignition switch 2 is input to the interface in addition to the speed signal $S_v$, fuel signal $S_f$, washer signal $S_w$. Moreover, in this embodiment, various additional signals are input to the interface such as an electronic controlled gasoline injection pulse signal $S_e$, automatic speed control signal $S_a$, BCD clock signal $S_t$, radiator liquid signal $S_r$, battery liquid signal $S_b$.

The numeral 21 denotes a keyboard, which is provided in place of the switches 4 and 5.

By using a number of keys on the keyboard 21, it is possible to previously select different items of information required to be indicated to the driver.

The numeral 11' denotes a voice synthesizer using a linear prediction coding (LPC) system including three LSI units, a memory unit (ROM) 22, a synthesizer unit 23 (oscillator, filters, and D-A converters), and a control unit or microcomputer 24, which corresponds to the voice memory 11 in FIG. 1. Control unit 24 is a microcomputer comprising a CPU for controlling all the operations, a memory (ROM) for storing programs and fixed data, a memory (RAM) for storing input/output data, a clock oscillator, etc., which can implement all the operations corresponding to the counter 7, the voice selector 10, and the voice memory 11, as explained in the first embodiment in FIG. 1, using the method of time sharing.

As is well known in the art, a voice synthesizer based on the LPC system has recently been put on the market at a reasonable price by Texas Instruments Incorporated of the USA. FIG. 3 shows schematically the principle of operation of this voice synthesizer.

In this synthesizer, pseudo-random noise signals generated from the first sound source oscillator (white noise generator) 30 are selected by a switch 32 to produce voiceless sounds, and periodic impulse signals generated from the second source oscillator (inpulse genelator) 31 are selected by the switch 32 to produce voiced sounds. After being amplified by an amplifier 33, these signals are formed into a voice sound by a grid-type filter 34 where the resonance characteristics of the human vocal tract (vocal organs such as tongue and lips located above the vocal chords) in speaking is modeled, and are output as a synthesized voice signal after conversion into an analog signal through a D-A converter 35.

The different values of constants such as the pitch of the periodic impulse signal, the distinction between voiced and voiceless sounds, the ratio of the amplification of the amplifier 33, and the filter constant of the grid-type filter 34, are stored in the memory unit (ROM) 22 of FIG. 2.

The synthesizer unit 23 comprises various circuits which correspond to a first sound source oscillator 30, a second sound source oscillator 31, a switch 32, an amplifier 33, a grid-type filter 34, a D-A converter 35 so that the synthesized voice sound signal $V_s$ necessary for warning information can be output after being controlled according to the output signal selected by the controller 24.

As in the first embodiment, the voice signal $V_s$ output from the voice synthesizer 23 is adjusted by means of the electronic volume control 12 according to the control signal $C_n$ indicating a noise level from the noise sensor 13 within the passenger compartment, is amplified through the amplifier 14, and is output to the speaker 15.

In this case, it may be possible to input the noise signal $C_n$ transmitted from the noise sensor 13 to the microcomputer in the control unit 24 through the interface 20, to store the noise level, and finally to determine the voice volume, taking into consideration all the other factors such as the degree of urgency of the information, and the sound volume as adjusted by driver preference in other audio equipment within the vehicle in addition to the detected noise level. In the above case, the control signal to determine the voice volume is directly output from the computer 24 to the electronic volume control 12.

In the second embodiment as in the first embodiment, different items of information on vehicle conditions can be indicated to the driver. These include, for example, the distance traveled based on a trip meter signal, the distance which may be traveled on the remaining fuel based on a fuel signal, the rate of fuel consumption based on a fuel signal and a trip meter signal, and an average vehicle speed based on a trip meter signal and a time interval signal, in addition to the vehicle speed based on a speed signal, the electronic controlled gasoline injection condition based on an EGI pulse signal, the automatic speed control device condition based on an ASCD signal, the time based on a BCD clock signal, the radiator coolant state based on a radiator signal, the amount of washer liquid based on a washer signal, the amount of remaining fuel based on a fuel signal, and the amount of battery electrolytic solution based on a battery signal, as shown in FIG. 2.

Further, it is desirable to provide a timer to allow the voice warning system to be operated for a while even after the ignition switch has been turned off.

As described above, since the noise level within the passenger compartment is detected and the volume of the information on the vehicle operating conditions is adjusted in accordance with the noise level, it is possible to provide the driver with voice information at an appropriate sound level under any ambient noise conditions.

It will be understood by those skilled in the art that the foregoing description is in terms of preferred embodiments of the present invention wherein various changes and modifications may be made without departing from the spirit and scope of the invention, which is to be defined by the appended claims.

What is claimed is:

1. A voice warning system for an automotive vehicle, which comprises:
   (a) a plurality of information switches;
   (b) a multiplexer for selectively outputting one of various signals indicating vehicle operating conditions when one of said switches is depressed;
   (c) a voice output selector for outputting a voice output designation signal $D_s$ in accordance with the signal from said multiplexer;
   (d) a voice memory for storing a number of voice outputs and for outputting a series of voice signals $V_s$ in response to the voice output designation signal $D_s$ from said voice output selector;
   (e) an electronic volume control for controlling the level of voice signals $V_s$ outputted from said voice memory; and
   (f) a noise level sensor for detecting the noise level within the passenger compartment and for outputting a control signal $C_n$ to said electronic volume control,
   whereby the volume of warning information is automatically controlled according to the noise level within the passenger compartment.

2. A voice warning system for an automotive vehicle, which comprises:
   (a) a keyboard for previously selecting various signals indicating vehicle operating conditions;
   (b) an interface for inputting and outputting the various signals selected by said keyboard;
   (c) an LPC type voice synthesizer system comprising:
      (1) a voice synthesizer having a first sound source oscillator for generating pseudo-random noise signals, a second sound source oscillator for generating periodic impulse signals, a grid-type filter of vocal tract model, and a D-A converter for converting a digital voice signal to an analog voice signal, $V_s$,
      (2) a memory unit (ROM) for storing voices synthesized by said voice synthesizer;
      (3) a control unit comprising a microcomputer for controlling input/output of the various signals through said interface and for producing different items of voice information through said synthesizer;
   (d) an electronic volume control for controlling the level of voice signal $V_s$ output from said synthesizer;
   (e) a noise level sensor for detecting the noise level within the passenger compartment and for outputting a control signal $C_n$ to said electronic volume control,
   whereby the volume of warning information is automatically adjusted to an appropriate voice level according to the noise level within the passenger compartment.

3. A voice warning system for an automotive vehicle as set forth in claim 1 or 2, wherein said noise level sensor comprises:
   (a) a microphone for detecting noise;
   (b) an amplifier for amplifying the detected noise;
   (c) a rectifier for rectifying the amplified noise; and
   (d) a smoother for smoothing the rectified noise.

* * * * *